United States Patent
Pitts et al.

(10) Patent No.: US 6,567,323 B2
(45) Date of Patent: May 20, 2003

(54) MEMORY CIRCUIT REDUNDANCY CONTROL

(75) Inventors: Robert L. Pitts, Dallas, TX (US); Clayton O. Timmons, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 12 days.

(21) Appl. No.: 10/077,432

(22) Filed: Feb. 15, 2002

(65) Prior Publication Data

US 2002/0118581 A1 Aug. 29, 2002

Related U.S. Application Data

(60) Provisional application No. 60/272,352, filed on Feb. 27, 2001.

(51) Int. Cl.$^7$ ................................................ G11C 7/00
(52) U.S. Cl. .................. 365/200; 365/201; 365/189.02; 365/230.02
(58) Field of Search .................. 365/200, 201, 365/189.02, 230.02, 230.03; 369/83

(56) References Cited

U.S. PATENT DOCUMENTS 5,555,522 A * 9/1996 Anami et al. ................ 365/200
6,278,678 B1 * 8/2001 Iida .......................... 369/47.13

* cited by examiner

*Primary Examiner*—David Lam
(74) *Attorney, Agent, or Firm*—Robert D. Marshall, Jr.; W. James Brady, III; Frederick J. Telecky, Jr.

(57) ABSTRACT

A memory having flexible column redundancy and flexible row redundancy plural column sticks, each column stick comprising a plurality of data lines. Positioned on either side of the memory are redundant column sticks each comprising a plurality of data lines. A column redundancy control identifies a faulty operating column stick in the memory and generates a column shift control signal to a column shift multiplexer that responds to the column shift control signal to substitute in the memory a redundant column stick for the identified faulty operating column stick. Similar redundant row sticks above and below the normal rows enable a row redundancy controller to signal a row shift multiplexer to replace a faulty operating row stick in the memory.

16 Claims, 9 Drawing Sheets

MEMORY CIRCUIT REDUNDANCY CONTROL

This application claims priority under 35 USC §119(e)(1) of Provisional Application No. 60/272,352, filed Feb. 27, 2001.

TECHNICAL FIELD OF THE INVENTION

This invention relates to memory circuit failure correction and more particularly to multiple row and multiple column redundancy correction for memory circuits in a memory bank.

BACKGROUND OF THE INVENTION

Memory banks comprising multiple memory circuits in a configuration having a plurality of columns and a plurality of rows are extensively used for data processing. Although such memory circuits are manufactured to be reasonably reliable, there are occasions when single or multiple bit failures in either columns or rows will corrupt the data to be processed. This is an intolerable condition. Significant effort has been expended to develop techniques for repair of a memory circuit to insure uninterrupted and continuous processing of data. To repair memory circuits the failing bits are detected during post manufacture testing of the memory. An important issue in the correction of memory circuit failure is to minimize the potential for data loss or data corruption. The high speed processing systems of today that are processing gigabytes or terabytes of information require reliable circuit failure correction prior to being placed into operation.

Heretofore, complex systems have been developed for correcting a memory circuit failure. One solution to correct memory circuit failure relied on redundancy control coupled to one or more banks of memory circuits arranged in a configuration having a plurality of columns and a plurality of rows. This solution to memory circuit failure utilized one redundant column stick and/or one redundant row stick coupled to the memory bank. For purposes of this disclosure, a row stick is a group of adjacent rows sharing address decode. Likewise, a column stick is a group of adjacent columns sharing address decode. A redundancy controller responded to identification of a column stick failure to activate a shift multiplexer to activate the redundant column stick to correct for a column stick identified as having a memory circuit failure. A column stick failure is defined as having one or more bad bits within the column. This activation of the redundant column stick to correct for the column containing the memory circuit failure was achieved by shifting each column stick between the redundant column stick and the failed column stick, thereby effectively replacing the failed column stick with the redundant column stick through shift control. Similarly, correction of a failure in a row stick of the memory bank was achieved by shifting the redundant row stick into the memory bank to correct for the row stick of memory circuits containing a failed circuit. Again, this was achieved by shifting each row stick between the redundant row stick and the failed row stick, thereby in effect replacing the failed row stick with the redundant row stick.

As the size of memory banks have increased due to the demand for processing large amounts of data, the single column stick and/or single row stick redundancy correction techniques do not provide the level of repair required for large memory banks. Additional correction is required, either in the row direction of a memory bank or in the column direction or both to insure adequate correction of memory circuit failure.

SUMMARY OF THE INVENTION

In accordance with the present invention, there is provided flexible column stick redundancy of a multi-column stick memory bank having a plurality of rows of memory circuits. Two redundant column sticks of memory circuits, one on each end of the memory bank, enables any two bad column sticks in the memory bank to be replaced utilizing shift multiplexing. The output lines from each column stick of memory circuits terminate at a bank of shift elements in a shift multiplexer that responds to a shift control signal to perform redundant column stick substitution as required by the shift control signals of a redundancy controller. When the memory bank is post-manufacture tested and found to be functioning without failure, the redundant column sticks are not used and the data lines of the operating column sticks of the memory bank flow straight through the shift multiplexer.

Further in accordance with the present invention, there is provided a memory bank having flexible column stick redundancy. The memory has a multi-column stick configuration, each column stick comprising a plurality of data lines. A plurality of redundant column sticks provide flexible column stick redundancy, where each redundant column stick comprises a plurality of data lines. A redundancy controller identifies a fault in the operation of a column stick in the memory bank and in response generates a shift control signal. A shift multiplexer responds to the shift control signal to activate one of the plurality of redundant column sticks to correct for the identified faulty operating column stick in the memory bank. This correction is achieved by shifting each of the column sticks between the redundant column stick and the failed column stick such that the column stick adjacent the failed column stick takes over the data processing for the failed column stick.

The shift multiplexer in the memory bank having flexible column stick redundancy comprises a plurality of shift elements equal in number to the multi-column stick configuration of the memory. Each shift element of the plurality of shift elements responds to the shift control signal to shift to an adjacent column stick in the memory bank between the redundant column stick and the faulty operating column stick.

In addition, in accordance with the present invention, there is provided a memory bank having flexible row stick redundancy. The memory bank has a multi-row stick configuration with each row stick comprising a plurality of columns. A plurality of redundant row sticks are positioned in association with the row sticks of the memory bank with each redundant row stick comprising a plurality of columns. A redundancy controller identifies in post-manufacture testing a faulty operating row stick and generates a shift control signal. This shift control signal is applied to a shift multiplexer that responds thereto to activate a redundant row stick to correct for an identified faulty operating row stick in the memory bank.

In accordance with the present invention, there is provided a memory bank having flexible row redundancy wherein a shift multiplexer as a part thereof comprises a plurality of shift elements equal in number to the multi-row stick configuration of the memory bank. Each shift element of the plurality responds to the shift control signal to shift to an adjacent row stick in the memory.

A memory bank implemented in accordance with the present invention provides efficient and flexible column and row redundancy upon the post-manufacture testing and detection of faulty operating rows or columns. A further advantage of a memory bank implemented in accordance with the present invention is the lack of a requirement of column or row address comparison to determine if a defective column or row is being addressed.

BRIEF DESCRIPTION OF THE DRAWINGS

A more complete understanding of the present invention may be had by reference to the following detailed description when taken in conjunction with accompanying drawings, wherein.

DETAILED DESCRIPTION OF THE DRAWINGS

Figure 1:
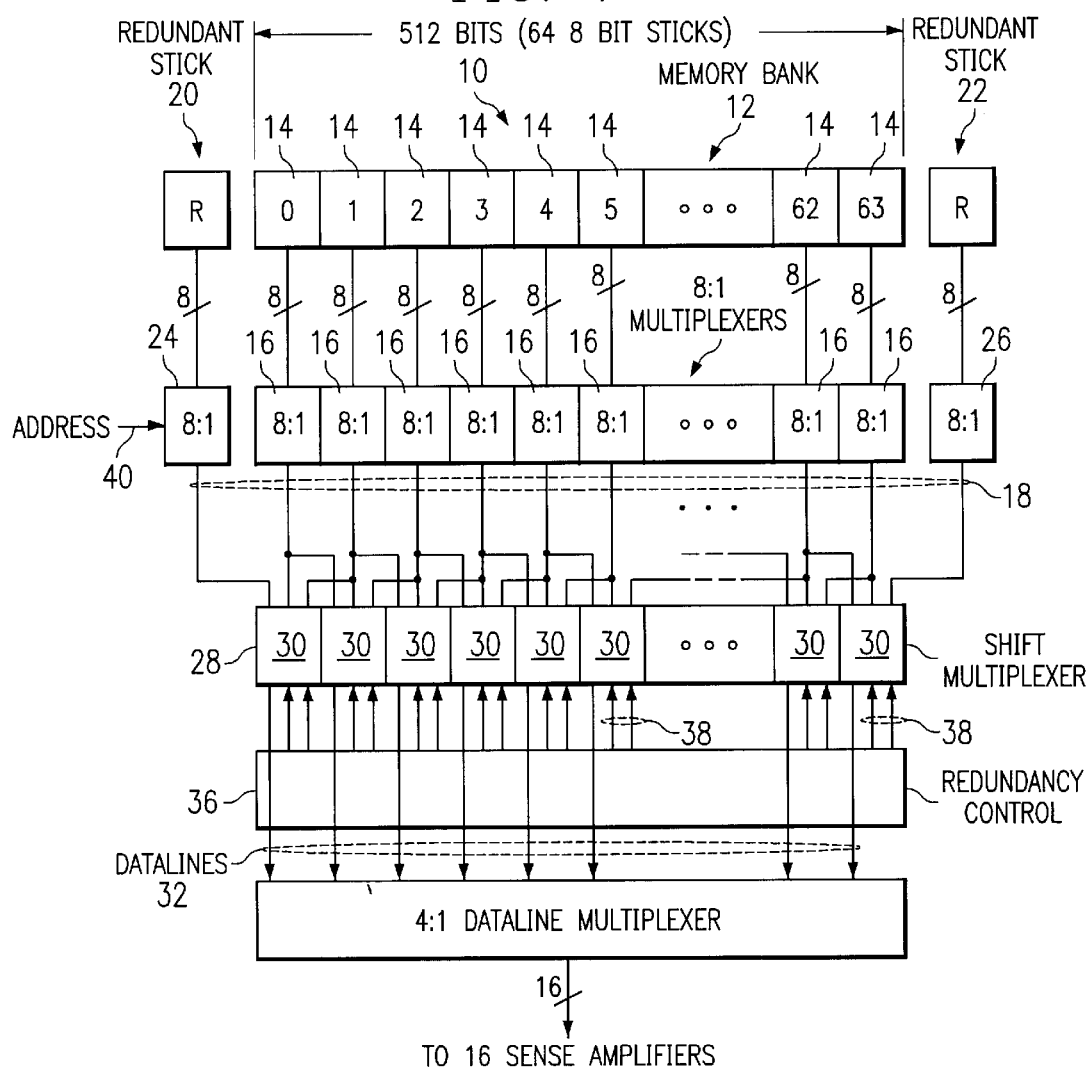
FIG. 1 is a schematic block diagram of a multiple column stick memory bank with shift multiplexed column stick redundancy.

Referring to FIG. 1, there is illustrated a memory 10 having one memory bank 12 comprising five hundred twelve bits in a 64 stick configuration, where each stick comprises an 8-bit column stick with a combined total of 512 bits. Each column stick 14 has eight output lines coupled to an eight-to-one multiplexer 16 for multiplexing the data from the memory bank 12 into one signal applied to a shift multiplexer 28. The shift multiplexer 28 removes the bad column stick and multiplexes the data onto global data lines 32. Associated with the memory bank 12 on each end thereof is a redundant column stick 20 or 22 having an eight-bit configuration with output lines coupled to eight-to-one multiplexers 24 and 26, respectively.

The redundancy controller contains the data required to properly shift the redundant sticks when power on the memory circuit. The data is stored in non-volatile elements such that each time power is applied to the circuit the data will be present to invoke the proper redundancy control. Non-volatile elements commonly used include laser fuse bits, electrical fuse bits, or any of a variety of programmable read only memory elements.

Although the memory bank 12 and the redundant columns 20 and 22 are described with reference to eight bits, it will be understood that the invention is also applicable to memory banks having other bit configurations, such as 4 bits, 16 bits or 32 bits. A memory bank having 8-bit column sticks is illustrated by way of example only.

Each of the multiplexers 24 and 26 are also coupled to the shift multiplexer 28. All the global data lines 32 are coupled to a shift multiplexer 28 comprising a plurality of shift elements 30 such as detailed in FIG. 2. The multiplexers 24 and 26 are individually coupled to only one of the shift elements 30. The multiplexers 16 for the first and last column sticks in the memory bank 12 are coupled to two adjacent shift elements 30. All the remaining column sticks 14 of the memory bank 12 between the first column stick and the last column stick are coupled to three shift elements 30. As illustrated in FIG. 1 each of the column sticks 14 of the memory bank 12 between the first and last column sticks are coupled straight through a shift element 30 and to adjacent shift elements 30. Thus, each of the column sticks 14 couples straight through to a shift element 30 and to one shift element to the left and one shift element to the right. Each of the shift elements 30 switches one of the input lines coupled thereto to a global data line 32. Each of the global data lines 32 are coupled to a data line multiplexer 34 having an output typically applied to sixteen sense amplifiers (not shown).

Control of the shift elements 30 of the shift multiplexer 28 is provided by a shift control signal on signal lines 38 of a redundancy control 36. The redundancy control 36 comprises an array of memory elements permanently configured to perform selective activation of the shift elements 30 to accommodate faults in the operation of one of the 64 column sticks of the memory bank 12. The redundancy control 36 provides a shift left or shift right control bit to shift selected shift elements 30 either left or right to the adjacent column stick of the shift multiplexer 28. This has the effect of activating either the redundant column stick 20 or the redundant column stick 22 to effectively replace the column stick identified by data in the redundancy control 36. Thus, to replace a column stick identified as having a fault in operation, the redundancy control 36 activates the associated shift element 30 and sends a left or right shift bit to the shift elements 30 to replace the column stick having a fault operation with either the redundant column stick 20 or the redundant column stick 22, depending on the location of the column stick identified as having a fault operation.

The redundancy control 36 contains permanent data which identifies one or two column stick faults in the memory bank 12. Each time the memory is powered up the permanent data initializes and activates the column stick redundancy. This requires a small amount of time at power up, but remains active during the power cycle. There is no access time penalty once the device has properly initialized.

Note, that the address line 40 is coupled to the multiplexers 16, 24 and 26 to properly address the desired column within the memory bank 12.

Figure 2:
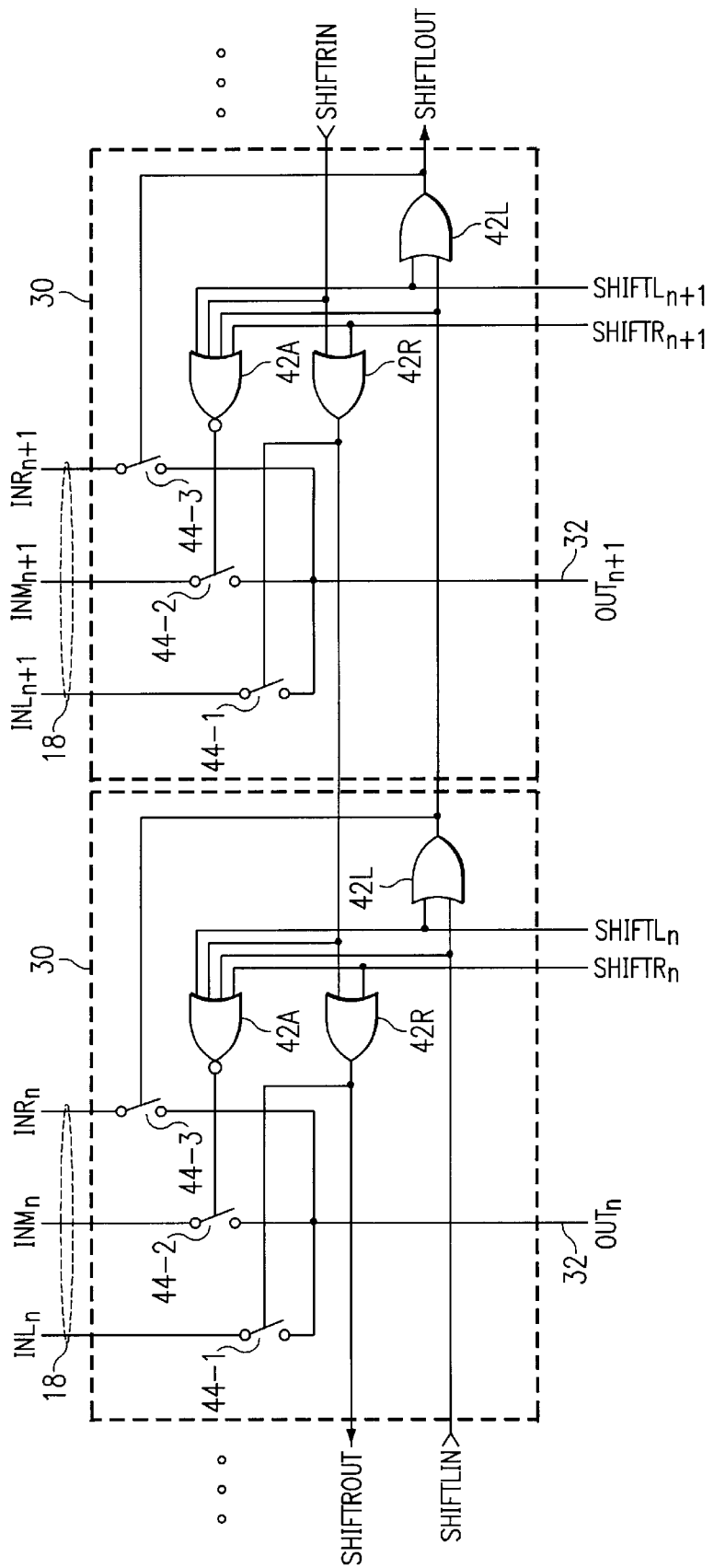
FIG. 2 is a logic diagram of two interconnected shift elements of the shift multiplexer for the memory bank of FIG. 1.

Referring to FIG. 2, there is illustrated two of the shift elements 30 of the shift multiplexer 28. Each of the shift registers includes logic gates 42 and a bank of switches 44, each individually controlled by the output of one of the gates 42.

The output lines 18 from the multiplexers 16, 24, and 26 are coupled to the switches 44. Each of the three switches 44 are interconnected to the global data line 32. All the shift elements 30 of the shift multiplexer 28 are similarly interconnected with the output of the gate 42R coupled to the input of the gate 42R of the adjacent shift element 30. The output of the gate 42R is a shift right signal signifying that the redundant column stick 22 is utilized to effect replacement of a column identified as having a fault operation. To shift the redundant column stick 20 to effect a replacement of a column having a fault operation, the gate 42L of one shift element 30 outputs a signal coupled to the input of the gate 42L of the adjacent shift element 30. The output of the gate 42L is a shift left bit applied to the adjacent shift element 30. This operation effectively utilizes the redundant column stick 20 in the replacement of a column identified with a fault operation.

The shift element 30 at the left end of the shift multiplexer 28 and the shift element on the right end of the shift multiplexer are coupled to ground, that is, both the SHIFTIN and SHIFTOUT terminals of the end shift elements are grounded.

In operation, when a column stick with a fault operation is identified and the redundancy control 36 outputs a bit to the gate 42A of the shift element 30 coupled to the column stick having the fault operation, the switch 44-2 is activated open, thereby isolating the column with a fault operation from the global data line 32. Depending on the location of the column identified with the fault operation, either the switch 44-1 is activated to a closed position or the switch 44-3 is activated to a closed position. In a shift right operation the switch 44-1 is activated closed and in a switch left scenario the switch 44-3 is activated to a closed position. Thus, the only shift control signal required from the redundancy control 36 is a bit to the gates 42L or 42R associated with the column having a fault operation and a sequential shifting of a bit to the other registers indicating a shift left or shift right operation.

Figure 3:
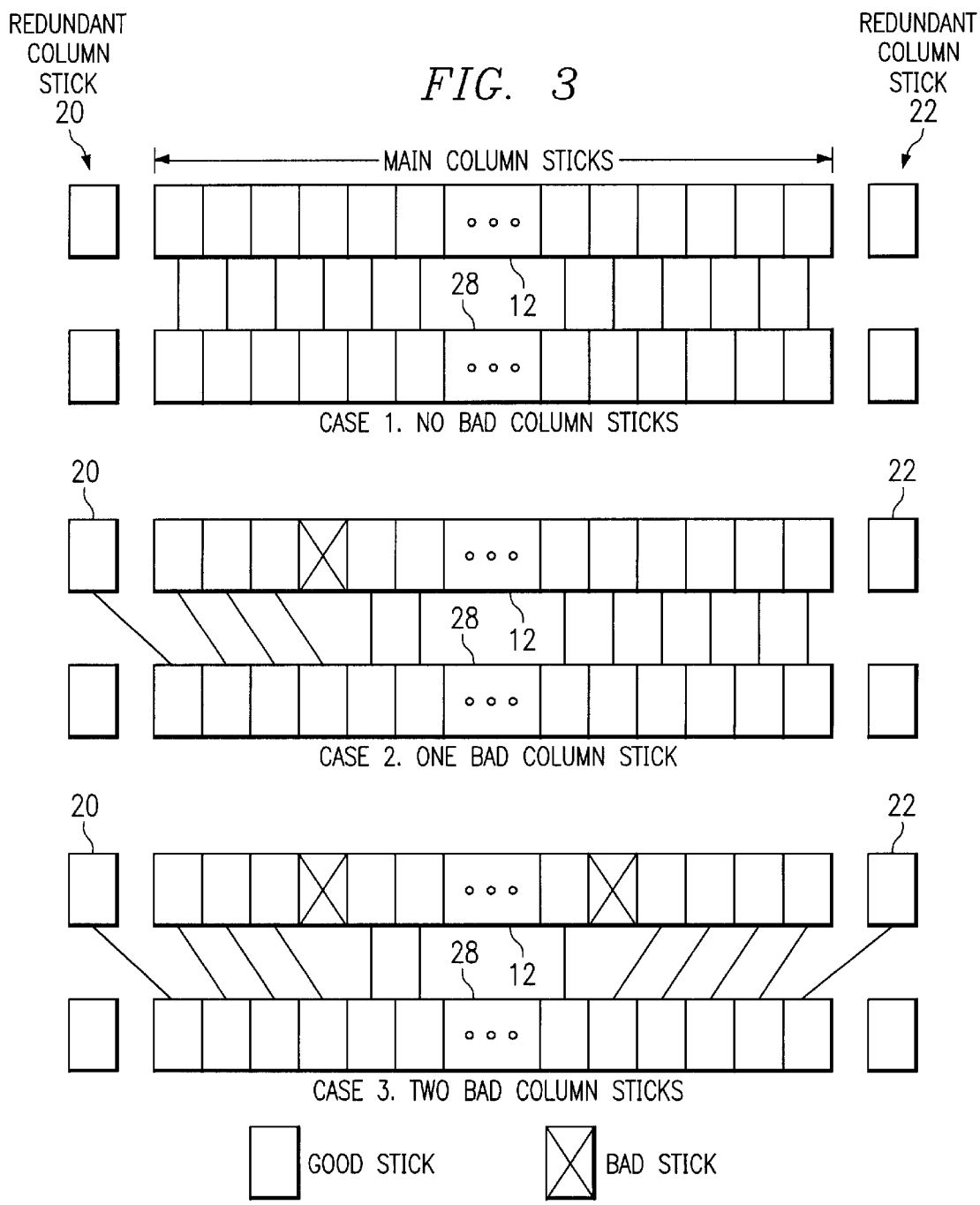
FIG. 3 illustrates the operation of the column stick redundancy of FIG. 1 with three case evaluations.

Referring to FIG. 3, there is illustrated three scenarios for operation of the column redundancy for the memory 10 of FIG. 1. In Case 1, there are no column sticks identified with a fault operation and each column stick 14 of the memory bank 12 outputs data through a multiplexer 16 to the global data line 32 through an associated shift element 30, and specifically through the switch 44-2 of the switch element. The redundant column sticks 20 and 24 are not utilized in this Case 1 scenario.

In Case 2, one column stick has been identified as having a fault operation and the redundancy control 36 activates the associated shift element 30 to open the switch 44-2. This removes the column stick identified with the fault operation from coupling to the global data line 32. The redundancy control 36 also outputs a right shift bit affecting a right shift by the first three column sticks 14 of the memory bank 12 one column to the right. In addition, the redundant column stick 20 is activated by closing the switch 44-1 of the shift element 30 normally associated with the first column stick 14 of the memory bank 12. All column sticks 14 in the memory bank 12 to the right of the column stick having been identified as having a fault operation are not affected and the data on output lines 18 passes through the switch 44-2 of the associated shift element 30 to the global data line 32.

The third scenario illustrated in FIG. 3 for operation of the column redundancy of the memory 10 of FIG. 1 illustrates when two column sticks have been identified as having a fault operation. In Case 3 of FIG. 3, the fourth column stick to the left is identified as having a fault operation and the fifth column stick from the right is likewise identified as having a fault operation. In this scenario, the redundancy controller 36 outputs a shift control signal to the shift element 30 associated with each of the column sticks as having a fault operation to open the switch 44-2 disconnecting the fault operating column stick from the global data lines 32. In addition, the redundancy control 36 outputs a shift right bit sequentially transferred to each of the first four left-most shift elements 30 to activate the switch 44-1, thereby effecting a shift right operation. Likewise, the redundancy control 36 outputs a shift left bit sequentially transferred to the five right-most shift elements 30 to activate the switch 44-3 to effect a switch left operation. Thus, the redundant column stick 20 is utilized in the shift right operation and the redundant column stick 22 is utilized in the shift left operation. The two redundant column sticks are thus activated to correct for the two column sticks identified as having a fault operation in the memory bank 12.

Figure 4:
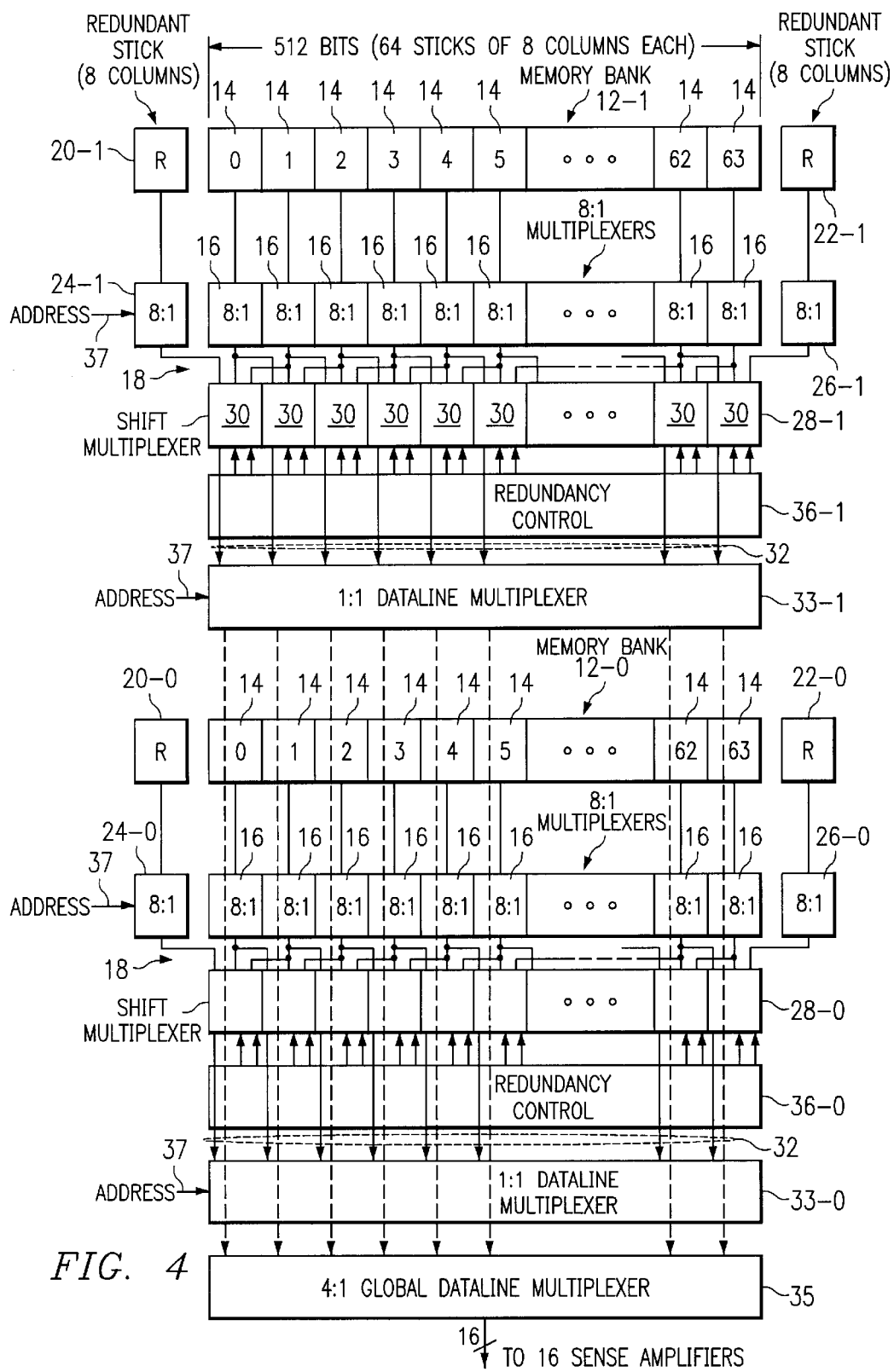
FIG. 4 is a schematic block diagram of a multi-bank memory having shift multiplexed column stick redundancy in accordance with the present invention.

Referring to FIG. 4, there is shown an embodiment of the invention having in memory banks 12-0 and 12-1. As illustrated in FIG. 4, each of the memory banks 12-0 and 12-1 includes five hundred twelve bits in a 64 stick configuration where each stick comprises an 8-bit column stick for a total of 512 bits. Each column stick 14 in memory bank 12-0 and 12-1 is coupled to a multiplexer 16 having an output coupled to an output line 18. As illustrated and described with reference to FIG. 1, the output lines 18 for the first and last column sticks 14 of the memory banks 12-0 and 12-1 are coupled to adjacent shift elements 30 of an associated shift multiplexer 28. All the other column sticks of each of the memory banks 12-0 and 12-1 have an output line 18 coupled to three adjacent shift elements 30.

The shift elements 30 comprise a shift multiplexer 28-0 and 28-1 for each of the memory banks 12-0 and 12-1. The global data lines 32 of each of the shift elements 30 for the shift multiplexers 28-0 and 28-1 are coupled to 1:1 dataline multiplexers 33-1 or 33-0, respectively. The global data lines 32 for the dataline multiplexer 33-0 and the global data lines 32 for the dataline multiplexer 33-1 are selectively coupled to a global dataline multiplexer. 35 in response to memory bank address inputs on address lines 37. Each of the shift multiplexers 28-0 and 28-1 receive shift control signals from a respectively coupled redundancy control 36-0 and 36-1.

Positioned to the left of each of the memory banks 12-0 and 12-1 is a redundant column stick 20-0 or 20-1, respectively. Similarly, positioned to the right of each of the memory banks 12-0 and 12-1 is a redundant column stick 22-0 or 22-1, respectively. Coupled to the output of the redundant column sticks 20-0 and 20-1 is a multiplexer 24-0 or 24-1, respectively, operating as a decode circuit for data from the associated redundant column stick 20-0 or 20-1. Similarly, coupled to the redundant column sticks 22-0 and 22-1 is a multiplexer 26-0 or 26-1, respectively.

As is apparent, the multi-bank memory of FIG. 4 comprises replications of the column redundancy memory 10 of FIG. 1. Operation of each of the memory banks 12-0 and 12-1 is similar to the operation of the memory bank 12 of FIG. 1. Column sticks identified in each of the memory banks 12-0 and 12-1 as having a fault operation result in a left shift or right shift for utilization of redundant column stick 20 or a redundant column stick 22 associated with the memory bank having the identified column with a fault operation.

It should be noted that more than two memory banks may comprise a total memory configuration. Two memory banks are illustrated and described by way of example.

Figure 5:
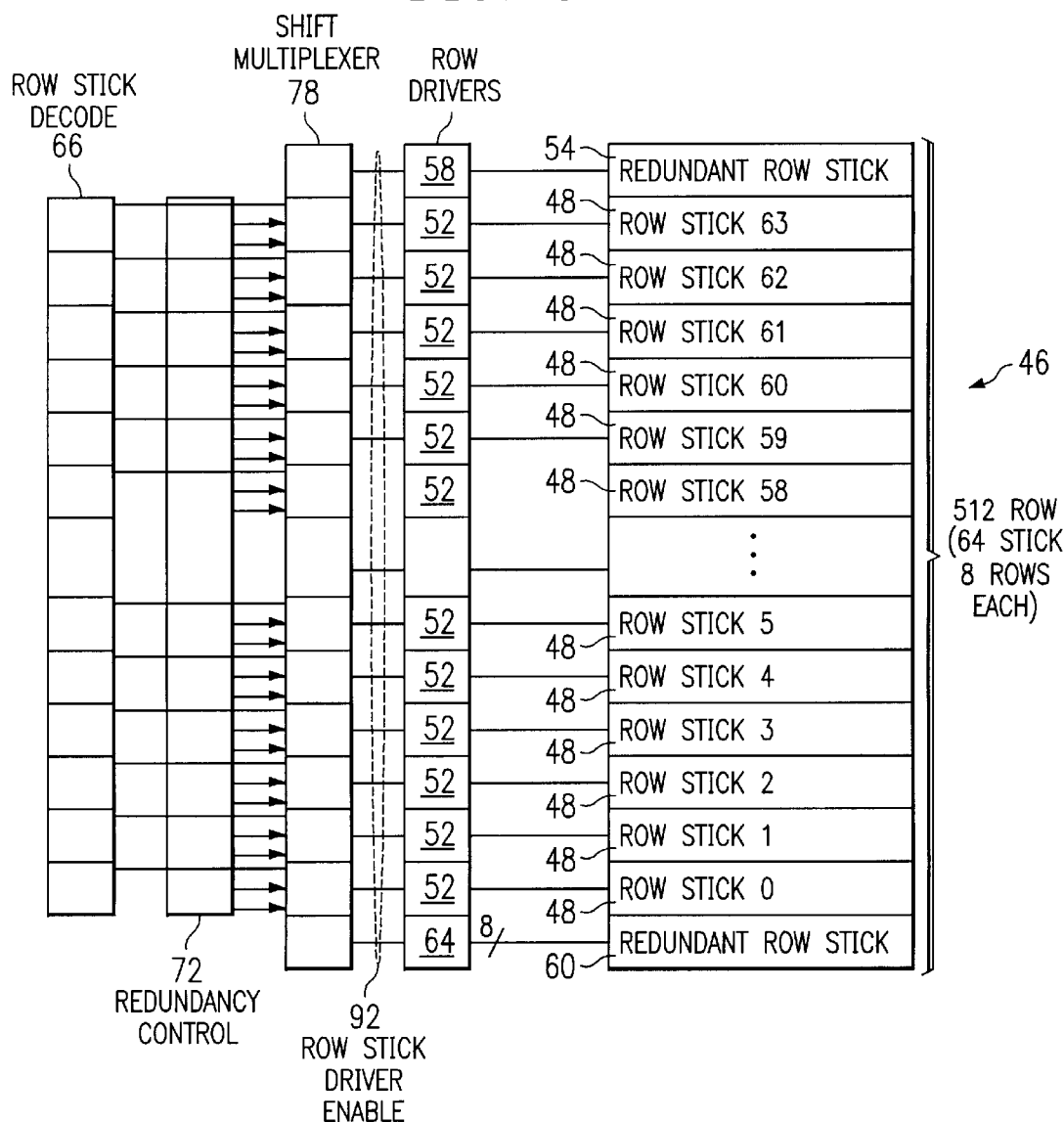
FIG. 5 is a schematic block diagram of a memory bank with shift multiplexed row stick redundancy in accordance with the present invention.

Referring to FIG. 5, there is illustrated an embodiment of the invention for shift multiplex row redundancy comprising a memory bank 46. The memory bank 46 comprises five hundred twelve bits in a 64 row stick configuration where each row comprises an 8-bit row stick. Each of the row sticks 48 has associated therewith a row driver 52. Positioned with respect to the upper end of memory 46 is an upper redundant row stick. Associated with the upper redundant stick 54 is a row driver 52 which functions to activate the drive enable lines from a shift multiplexer 78. Associated with the lower end of memory 46 is a lower redundant row stick 60. Coupled to the lower redundant row stick 60 is a row driver 52 which couples the data lines from the shift multiplexer 78 to the redundant row stick 60.

Data is shifted into each row stick 48 of the memory 46 by a row stick decoder 66. Coupled to the data lines 70 from the row stick decoder 66 is the shift multiplexer 78. Also coupled to the shift multiplexer 78 is a redundancy control 72 similar in operation of the redundancy control 36 and comprising a plurality of memory elements preset to shift the redundant row sticks up or down to effect a repair of a row stick 48 identified as having a fault operation. The redundancy control 72 responds to an identified fault in one or more of the row sticks 48 and generates shift control signals on lines 76 to the shift multiplexer 78. The shift control signals applied to the shift multiplexer 78 comprises the address of a row stick 48 identified as having a fault operation and a shift down or shift up signal applied to shift elements 80 of the shift multiplexer 78. Coupled to the drive enable lines 92 from the shift multiplexer 78 is the bank of row drivers 52 each responding to a local row address input. The row drivers 52 comprises a plurality of multiplexers individually coupled to one of the memory row sticks 48.

Each input to the row drivers 52 couples to one or more shift elements 80. The upper redundant row stick 54 and the lower redundant row memory stick 60 are coupled by a single line to the upper and lower shift elements 80, respectively. The upper row stick 48 and the lower row stick 48 are coupled to the upper two shift elements 80 and the lower two shift elements 80, respectively. Each of the other row sticks 48 are connected to three adjacent shift elements 80 similar to the shift elements 30 as illustrated in FIG. 1.

Figure 6:
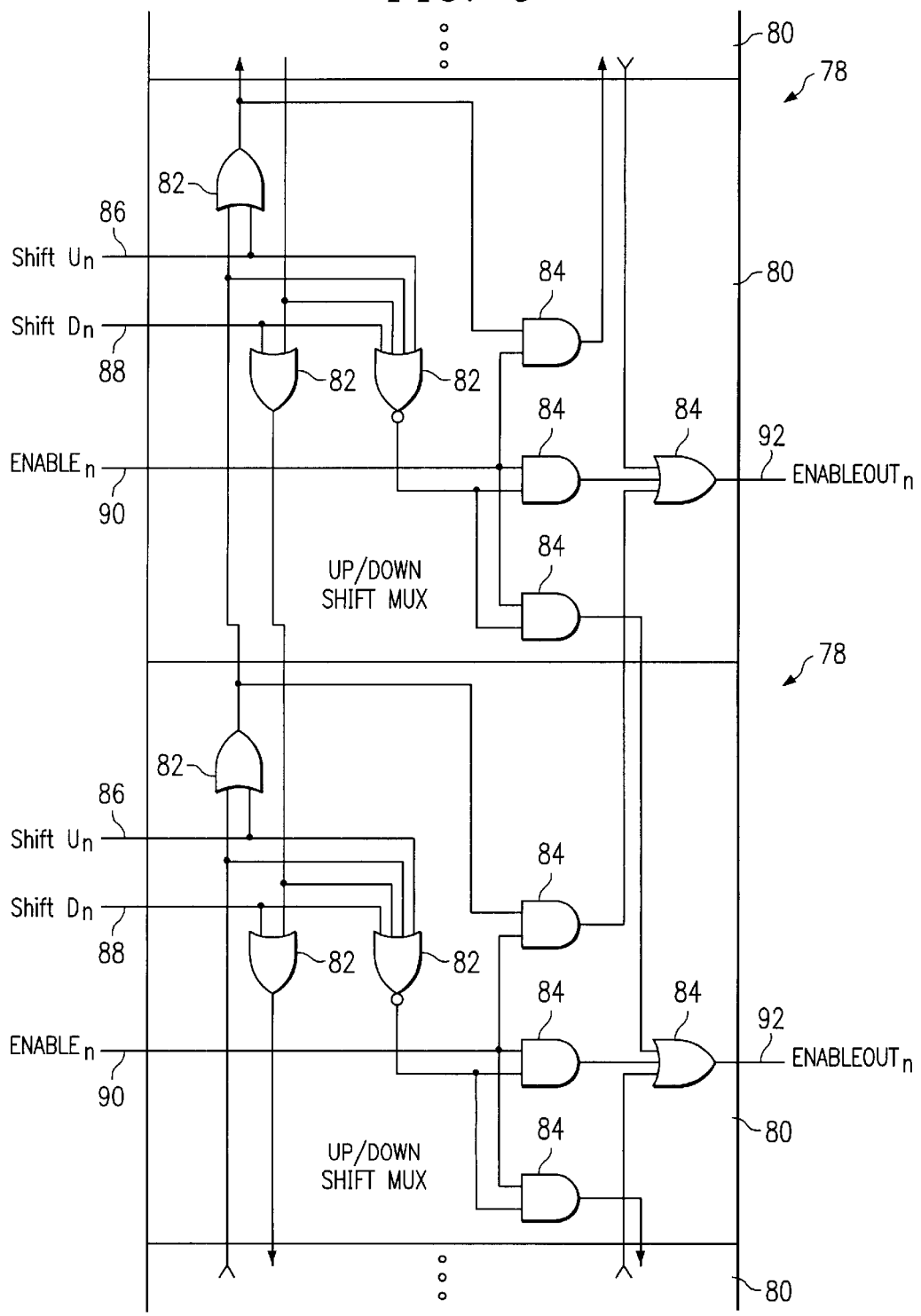
FIG. 6 is a schematic diagram of two interconnected shift elements for two row sticks of the shift multiplexer as illustrated in FIG. 5.

Referring to FIG. 6, there is illustrated a logic diagram of two adjacent shift elements 80 of the shift multiplexer 78. Each of the shift elements 80 are sequentially connected to an adjacent shift element in the multiplexer 78. Each shift element 80 comprises shift gates 82 and enable gates 84. In addition, each shift element 80 includes a shift-up signal line 86, a shift-down signal line 88 and an enable signal line 90. Also, each shift element 80 includes an enable line 92.

In response to identification of a row stick having a fault operation, the redundancy control 72 outputs a shift control signal identifying the row stick having the identified fault operation on an enable line 90 and also outputs either a shift-up or shift-down signal on line 86 or line 88. The output on enable line 92 is applied to the row driver 52 and more specifically applied to one of the multiplexers of a row driver 52.

Figure 7:
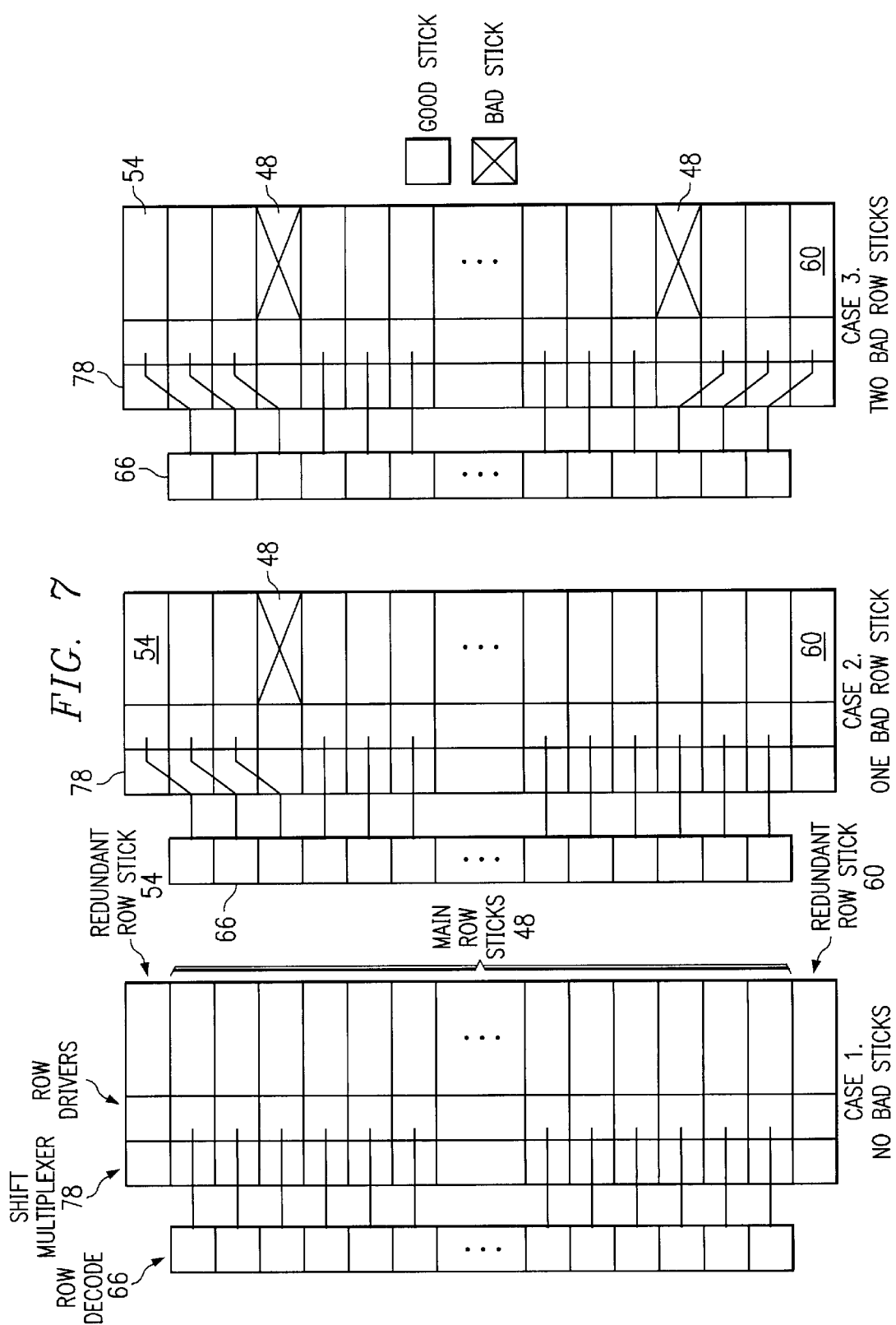
FIG. 7 is a three case illustration of row stick redundancy shifting in accordance with the memory bank of FIG. 5.

Referring to FIG. 7, there is illustrated three scenarios for operation of the redundancy control 72 to activate the shift multiplexer 78 to shift the row sticks up and/or down to bypass a row stick(s) that have been identified with a fault operation. In case 1, there are no row sticks identified with a fault operation in each row stick 48 of the memory bank 46 functions to store data in accordance with design specifications. The upper redundant row stick 54 and the lower redundant row stick 60 are not utilized in the case 1 scenario.

In case 2, one row stick 48 has been identified as having a fault operation and the redundancy control 72 activates the associated shift element 80 to effect an upward shift isolating the fault operating row stick 48. This removes the column stick identified with the fault operation from the memory bank 46. In case 2, the redundancy control 72 outputs a shift up signal to the shift elements 80 associated with the row sticks 48 above the fault operating row stick. This shifting up of the row sticks utilizes the upper redundant row stick 54 as an effective substitute for the fault operating row stick 48. All the row sticks 48 in the memory bank 46 below the fault operating stick function in accordance with design specifications.

In the case 3 as illustrated, two row sticks 48 on either side of the middle row stick have been identified as having a fault operation. Identification of the fault operation of these two row sticks is identified in the redundancy control 72 that outputs a shift-up signal to the shift elements 80 associated with row sticks 48 above the fault operating row stick and a shift-down signal to the shift elements 80 for row sticks 48 below the identified fault operating row stick. This shifting up of row sticks utilizes the upper redundant row stick 54 as an effective substitute for the fault operating row stick 48 and shifting down utilizes the lower redundant row stick 60 as an effective substitute for one of the fault operating row sticks. If only one row stick is identified with a fault operation (see case 2), the redundancy control 72 outputs either shift-up signals or shift-down signals to utilize either the upper redundant row stick 54 or the lower redundant row stick 60 as an effective substitute in the memory bank 46.

FIGS. 5 and 7 illustrate an embodiment of the invention for row stick redundancy utilizing a single memory bank 46. For a memory having multiple memory banks 46, the embodiment of FIG. 5 would be replicated for each memory bank in the memory. Operationally, each additional memory bank 46 would function as described with reference to FIG. 7.

Figure 8A:
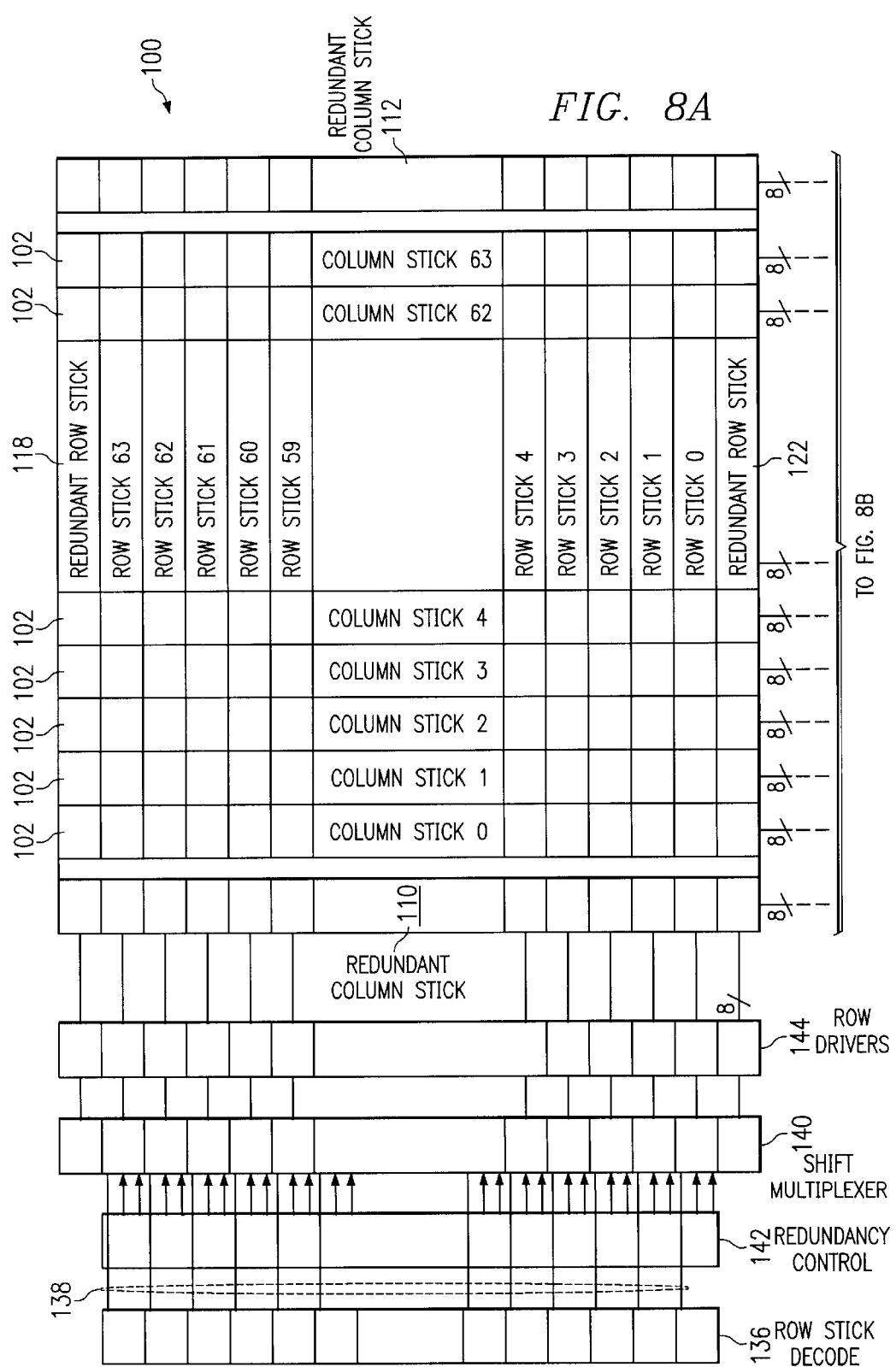
FIG. 8 is a schematic block diagram of a memory bank with shift multiplexed column stick redundancy and shift multiplexed row stick redundancy in accordance with the present invention.
Figure 8B:
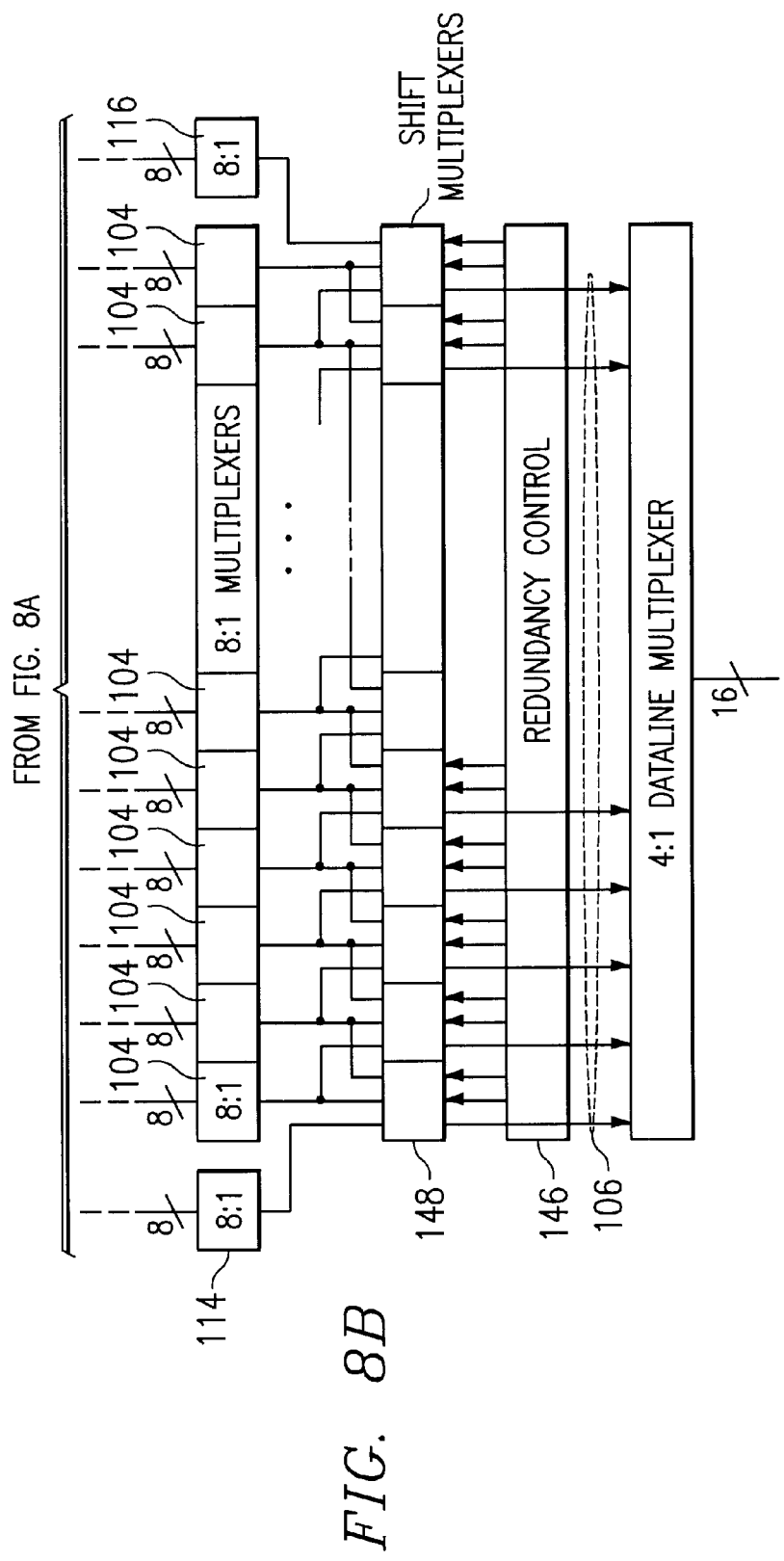

Referring to FIG. 8, there is shown an embodiment of the invention having both column redundancy control and row redundancy control The memory 100 typically comprises 64 column sticks 102 each coupled through a decode eight-to-one multiplexer 104 to global data lines 106. The memory 100 comprises typically five hundred twelve bits in a 64 stick configuration, where each stick comprises an 8-bit column. On the left side of the memory 100 is a redundant column stick 110 and positioned to the right of the memory 100 is a redundant column stick 112. Coupled to the column stick 110 is a decode eight-to-one multiplexer 114, and coupled to the output of the redundant column stick 112 is a decode eight-to-one multiplexer 116.

Positioned above the memory column sticks is an upper redundant row stick 118 comprising column sticks 102 coupled through the decode eight-to-one multiplexer 104 to the global data lines 106. At the bottom of the memory 100 there is positioned a lower redundant row stick 122. The lower redundant row stick 122 is also coupled through the decode eight-to-one multiplexer 104 to the global data lines 106.

Redundant row control for the memory 100 is similar to the redundant row control of the embodiment of FIG. 5. A row stick decoder 136 has output lines 138, equal in number to the rows of the memory 100, coupled to a shift multiplexer 140. A redundancy control 142 receives identification of a memory row stick having a fault operation to send an address and shift up and/or shift down control signals to the multiplexer 140. Driver enable lines output from the shift multiplexer 140 are coupled to row drivers 144 having output lines coupled to the left redundant column stick 110. Operation of the row redundancy is as explained with reference to FIGS. 5, 6 and 7.

Column redundancy control is achieved by a redundancy control 146 having a control signal output connected to a shift multiplexer 148. The shift multiplexer 148 connects to the data lines from the decode eight-to-one multiplexers 104 in a configuration as illustrated and described with reference to FIGS. 1 and 4. The shift multiplexer 148 comprises shift elements as illustrated and described with reference to FIG. 2.

Operation of column redundancy control is similar to the column redundancy control as described with reference to FIGS. 1 and 4.

Although preferred embodiments of the invention have been illustrated in the accompanying drawings and described in the foregoing Detailed Description, it will be understood that the invention is not limited to the embodiments disclosed, but is capable of numerous rearrangements and modifications of parts and elements without departing from the spirit of the invention.

What is claimed is:

1. A memory having flexible column stick redundancy, comprising:
   a memory having a multi-column stick configuration, each column stick comprising a plurality of data lines;
   a plurality of redundant column sticks each comprising a plurality of data lines;
   a redundancy control identifying a faulty operating column stick in the memory and generating a shift control signal; and
   a shift multiplexer responsive to the shift control signal to effect a substitution of a redundant column stick for the identified faulty operating column stick in the memory, said shift multiplexer comprising a plurality of shift elements equal in number to the multi-column stick configuration of the memory, each shift element of the plurality of shift elements responsive to the shift control signal to shift to an adjacent column stick in the memory.

2. A memory having flexible column stick redundancy as set forth in claim 1 wherein the redundancy control generates the shift control signal comprising the address of the faulty operating column stick and a left or right shift direction to each shift element.

3. A memory having flexible column stick redundancy, comprising:
   a memory having a multi-column stick configuration, each column stick comprising a plurality of data lines;
   a plurality of redundant column sticks each comprising a plurality of data lines;
   a redundancy control identifying a faulty operating column stick in the memory and generating a shift control signal; and
   a shift multiplexer responsive to the shift control signal to effect a substitution of a redundant column stick for the identified faulty operating column stick in the memory, said shift multiplexer comprising a plurality of interconnect shift right or shift left logic circuits for propagating a shift control signal to replace a redundant column stick for an identified faulty operating column stick in the memory.

4. A memory having flexible column stick redundancy as set forth in claim 3 wherein the logic circuits couple to an adjacent left or adjacent right column stick of the memory in response to a shift control signal.

5. A memory having flexible column stick redundancy, comprising:
   a plurality of interconnected memories, each memory having a multi-column stick configuration, each column stick comprising a plurality of data lines;
   a first redundant column stick associated with each memory, each column stick comprising a plurality of data lines;
   a second redundant column stick associated with each memory, each column stick comprising a plurality of data lines;
   a redundancy control associated with each memory and identifying a faulty operating column stick in the associated memory and generating a shift control signal for the associated memory; and
   a shift multiplexer associated with each memory and responsive to the shift control signal to substitute in the associated memory either the first redundant column stick or the second redundant column stick for an identified faulty operating column stick in the associated memory, wherein each shift multiplexer comprises a plurality of shift elements equal in number to the multi-column stick configuration of the associated memory, each shift element of the plurality of shift elements responsive to the shift control signal to substitute either the first redundant column stick or the second redundant column stick for the faulty operating column stick in the associated memory.

6. A memory having flexible column stick redundancy as in claim 5 wherein the redundancy control for each associated memory generates a shift control signal comprising the address of a faulty operating column stick and a left or right shift direction to substitute either the first redundant column stick or the second redundant column stick for the faulty operating column stick in the associated memory.

7. A memory having flexible column stick redundancy as in claim 5, further comprising:
   a plurality of multiplex circuits individually coupled to one of the plurality of memories, each multiplex circuit multiplexing data in each column stick of a coupled memory to a global data line.

8. A memory having flexible column stick redundancy as in claim 5, further comprising:
   a first redundant multiplex circuit for multiplexing data of the first redundant column stick to a global data line; and
   a second redundant multiplex circuit for multiplexing data of the second redundant column stick to the global data line.

9. A memory having flexible row stick redundancy, comprising:
   a memory having a multi-row stick configuration, each row comprising a plurality of data rows;
   a plurality of redundant row sticks each comprising a plurality of data rows;
   a redundancy control identifying a faulty operating row stick in the memory and generating a shift control signal; and
   a shift multiplexer responsive to the shift control signal to substitute in the memory a redundant row stick for the identified faulty operating row stick, said shift multiplexer comprising a plurality of shift elements equal in number to the multi-row stick configuration of the memory, each shift element of the plurality of shift elements responsive to the shift control signal to shift to an adjacent row stick in the memory.

10. A memory having flexible row stick redundancy as set forth in claim 9 wherein the redundancy control generates the shift control signal comprising the address of the faulty operating row stick and an up or down shift direction to each shift element.

11. A memory having flexible row stick redundancy, comprising:
    a memory having a multi-row stick configuration, each row comprising a plurality of data rows;
    a plurality of redundant row sticks each comprising a plurality of data rows;
    a redundancy control identifying a faulty operating row stick in the memory and generating a shift control signal; and a shift multiplexer responsive to the shift control signal to substitute in the memory a redundant row stick for the identified faulty operating row stick, said shift multiplexer comprises a plurality of interconnect shift up or shift down logic circuits for propagating a shift control signal to substitute in the memory a redundant row stick for an identified faulty operating row stick in the memory.

12. A memory having flexible row stick redundancy as set forth in claim 11 wherein the logic circuits couple to an adjacent up or an adjacent down row stick of the memory in response to a shift control signal.

13. A memory having flexible column stick and row stick redundancy, comprising:

a memory having a multi-column stick and multi-row stick configuration, each column stick and each row stick comprising a plurality of data lines;

a first redundant column stick comprising a plurality of data lines;

a second redundant column stick comprising a plurality of data lines;

a first redundant row stick comprising a plurality of data rows;

a second redundant row stick comprising a plurality of data lines;

a column redundancy control identifying a faulty operating column stick in the memory and generating a column shift control signal;

a column shift multiplexer responsive to the column shift control signal to substitute in the memory either the first redundant column stick or the second redundant column stick for an identified faulty operating column stick in the memory;

a row redundancy control identifying a faulty operating row stick in the memory and generating a row shift control signal; and a row shift multiplexer responsive to the row shift control signal to substitute in the memory either the first redundant row stick or the second redundant row stick for an identified faulty operating row stick in the memory.

14. A memory having flexible column stick and row stick redundancy as set forth in claim 13 wherein:

the column shift multiplexer comprising a plurality of shift elements equal in number to the multi-column stick configuration of the memory, each shift element of the plurality of shift elements responsive to the column shift control signal to shift to an adjacent column stick in the memory; and the row shift multiplexer comprises a plurality of shift elements equal in number to the multi-row stick configuration of the memory, each shift element of the plurality of shift elements responsive to the row shift control signal to shift to an adjacent row stick in the memory.

15. A memory having flexible column stick and row stick redundancy as in claim 14 wherein:

the column redundancy control generates a column shift control signal comprising the address of the faulty operating column stick and a left or right shift direction to each shift element of the column redundancy control; and the row redundancy control generates the row shift control signal comprising the address of the faulty operating row stick and an up or down shift direction for each shift element.

16. A memory having flexible column stick and row stick redundancy as in claim 13, further comprising:

a plurality of multiplexer circuits individually coupled to one of the column sticks, each multiplexer circuit multiplexing data in each column stick of the memory to a global data line.

* * * * *